(12) United States Patent
Seo et al.

(10) Patent No.: US 9,673,422 B2
(45) Date of Patent: Jun. 6, 2017

(54) DISPLAY DEVICE

(71) Applicant: SAMSUNG DISPLAY CO., LTD., Yongin-si, Gyeonggi-do (KR)

(72) Inventors: Ilhun Seo, Asan-si (KR); Youngjun Shin, Seongnam-si (KR); Byoungki Kim, Seoul (KR); Jiyoun Lee, Anyang-si (KR); Jaebeom Choi, Suwon-si (KR)

(73) Assignee: Samsung Display Co., Ltd., Yongin-Si, Gyeonggi-do (KR)

(*) Notice: Subject to any disclaimer, the term of this patent is extended or adjusted under 35 U.S.C. 154(b) by 0 days.

(21) Appl. No.: 15/013,195

(22) Filed: Feb. 2, 2016

(65) Prior Publication Data
US 2016/0260932 A1    Sep. 8, 2016

(30) Foreign Application Priority Data

Mar. 4, 2015 (KR) .................... 10-2015-0030594

(51) Int. Cl.
*H01L 51/52*    (2006.01)
(52) U.S. Cl.
CPC ................. *H01L 51/5271* (2013.01)
(58) Field of Classification Search
None
See application file for complete search history.

(56) References Cited

U.S. PATENT DOCUMENTS

2013/0299808 A1* 11/2013 Sugimoto ........... H01L 27/3258
                                                                  257/40
2015/0041777 A1*  2/2015 Chung ............... H01L 51/5271
                                                                  257/40
2016/0079567 A1*  3/2016 Cho .................... H01L 51/5284
                                                                  257/40

FOREIGN PATENT DOCUMENTS

| JP | 2005-114966 A | 4/2005 |
| KR | 10-2009-0065104 A | 6/2009 |
| KR | 10-2010-0090448 A | 8/2010 |
| KR | 10-2012-0065416 A | 6/2012 |
| KR | 10-2012-0070713 A | 7/2012 |
| KR | 10-2014-0041116 A | 4/2014 |
| KR | 10-2014-0073216 A | 6/2014 |
| WO | WO 2014/153801 A1 | 10/2014 |

* cited by examiner

*Primary Examiner* — Joseph Schoenholtz
(74) *Attorney, Agent, or Firm* — Lee & Morse, P.C.

(57) ABSTRACT

A display device includes a substrate and a reflection layer. The substrate includes a first emission region, a second emission region, a third emission region, and a non-emission region. The reflection layer overlaps the first emission region, the second emission region, and the non-emission region, and has an opening corresponding to the third emission region. The first emission region, the second emission region, and the third emission region emit different color light.

20 Claims, 9 Drawing Sheets

DISPLAY DEVICE

CROSS-REFERENCE TO RELATED APPLICATIONS

Korean Patent Application No. 10-2015-0030594, filed on Mar. 4, 2015, and entitled, "Display Device," is incorporated by reference herein in its entirety.

BACKGROUND

1. Field

One or more embodiments described herein relate to a display device.

2. Description of the Related Art

A variety of displays have been developed. Examples include liquid crystal displays, organic light-emitting displays, and plasma displays. These displays are commonly employed in smart phones, personal digital assistants, notebook computers, televisions, and other portable or electronic devices. One recent advance involves providing a mirror function in a display device. In order to realize a mirror function, a reflection member for reflecting exterior light may be on the display device.

SUMMARY

In accordance with one or more embodiments, a display device includes a first substrate including a first emission region, a second emission region, a third emission region, and a non-emission region; and a reflection layer overlapping the first emission region, the second emission region, and the non-emission region, the reflection layer having an opening corresponding to the third emission region, wherein the first emission region, the second emission region, and the third emission region are to emit different color light.

The reflection layer may overlap substantially an entirety of the first emission region and the second emission region. The third emission region may emit light having a wavelength longer than light to be emitted from the first emission region and the second emission region. The light to be emitted from the third emission region may have a wavelength ranging from about 610 nm to about 750 nm. Organic light-emitting diodes may be on respective ones of the first emission region, the second emission region, and the third emission region.

The display device may include a second substrate spaced from the first substrate, wherein the reflection layer is on the second substrate. The second substrate may include a first surface facing the first substrate; and a second surface that is an opposite surface of the first surface, wherein the reflection layer is on the first surface. The third emission region may have an area smaller than an area of each of the first emission region and the second emission region.

The reflection layer may include at least one of aluminum, chromium, silver, iron, platinum, mercury, nickel, tungsten, vanadium, or molybdenum. The opening may have an area smaller than an area of the third emission region. The reflection layer may include a first reflection layer overlapping the first emission region and the second emission region; and a second reflection layer overlapping the non-emission region, wherein the first reflection layer is thicker than the second reflection member.

The first reflection layer may have a thickness ranging from about 50 Å to about 180 Å, and the second reflection layer may have a thickness ranging from about 250 Å to about 500 Å. The first reflection layer may include a main reflection layer overlapping the non-emission region: and a sub reflection layer covering the main reflection layer and disposed on the first surface. The main reflection layer may have a thickness ranging from about 200 Å to about 320 Å, and the sub reflection layer may have a thickness ranging from about 50 Å to about 180 Å.

The reflection layer may include a first reflection layer contacting the first surface; and a second reflection layer on one surface of the first reflection layer and overlapping the non-emission region. The first reflection layer may have a thickness ranging from about 50 Å to about 180 Å, and the second reflection layer may have a thickness ranging from about 250 Å to about 320 Å. The reflection layer may include a first reflection layer overlapping the first emission region and the second emission region; and a second reflection layer overlapping the non-emission region, wherein a reflectivity of the first reflection layer is less than a reflectivity of the second reflection layer. The reflectivity of the first reflection layer may range from about 5% to about 50%, and the reflectivity of the second reflection layer may range from about 90% to about 100%.

In accordance with one or more other embodiments, a display device includes a first substrate including a first emission region, a second emission region, a third emission region, and a non-emission region; and a reflection layer overlapping the first emission region and the non-emission region and having an opening corresponding to the second emission region and the third emission region, wherein the first emission region, the second emission region, and the third emission region are to emit different color light. Each of the second emission region and the third emission region may emit light having a wavelength longer than a wavelength of light to be emitted from the first emission region.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
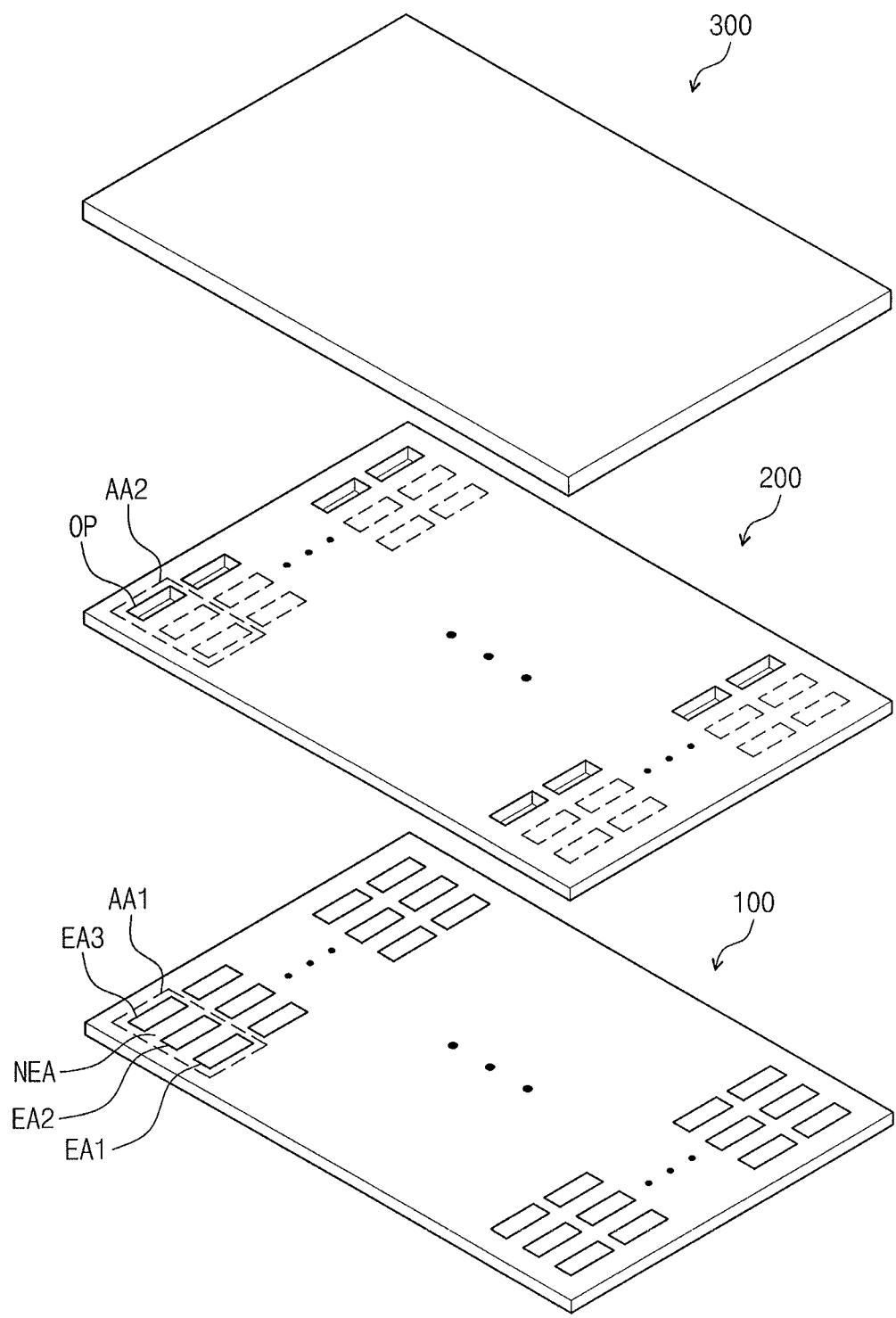
FIG. 1 illustrates an embodiment of a display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a display device which includes a first substrate 100, a reflection member 200, and a second substrate 300. The first substrate 100 includes a first emission region EA1, a second emission region EA2, a third emission region EA3, and a non-emission region NEA. The reflection member 200 is on the first substrate 100 and includes an openings OP which corresponds to the third emission region EA3. The second substrate 300 is on the reflection member 200. As illustrated in FIG. 1, a plurality of emission regions and corresponding openings may be included in one embodiment.

The first substrate 100 and the second substrate 300 are bonded by a bonding portion. An absorbent, filler, or the like, may be in a space between the first substrate 100 and the second substrate 300, which is formed by the bonding portion.

Figure 2:
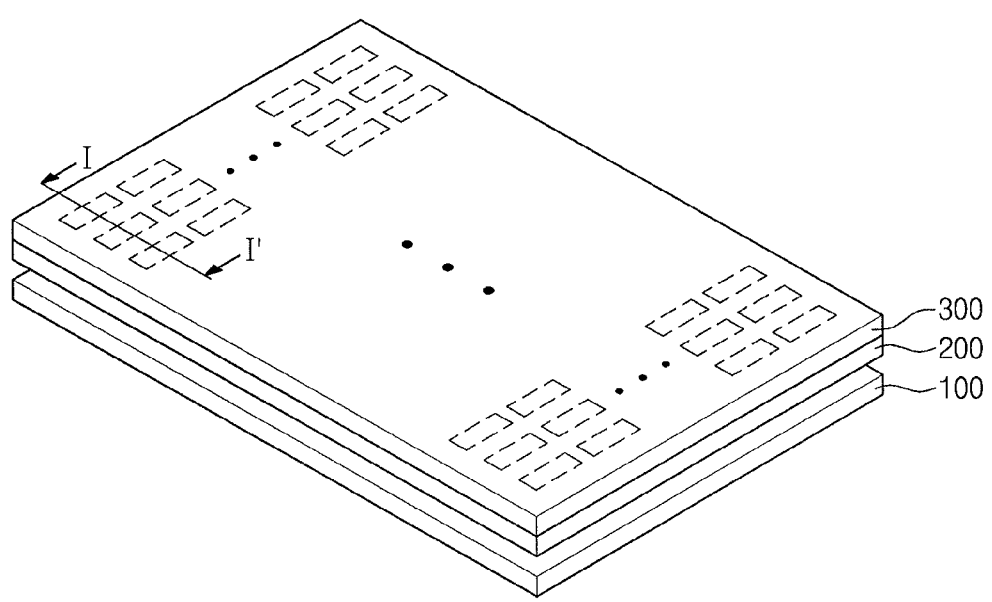
FIG. 2 illustrates an example of an assembled view of the embodiment in FIG. 1.
Figure 3A:
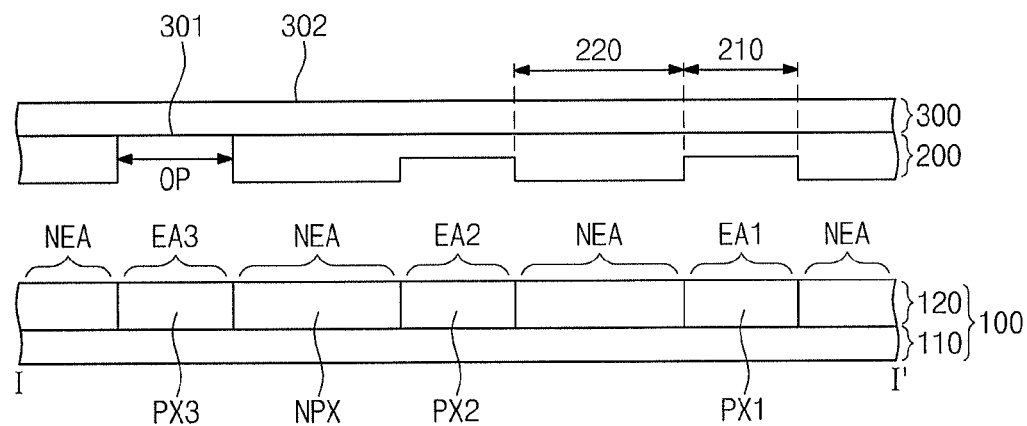
FIGS. 3A-3C illustrate examples of sectional views of the embodiment of FIG. 2.
Figure 3B:
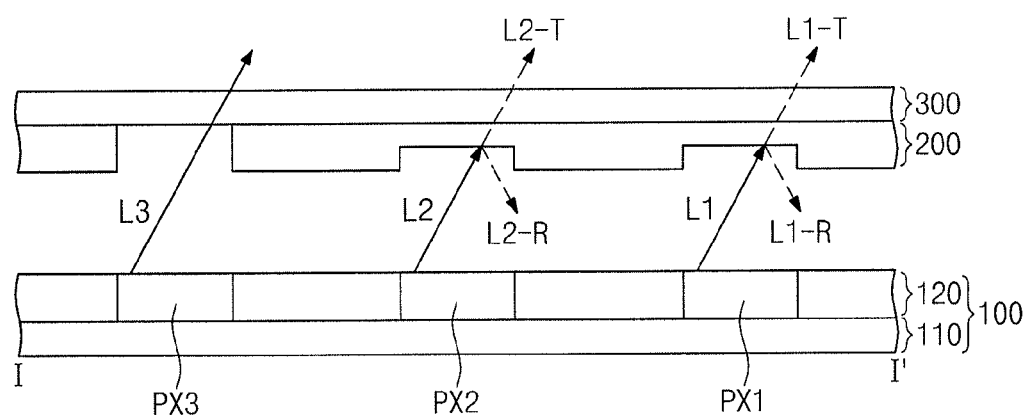

FIGS. 3A and 3B are cross-sectional views taken along line I-I' of FIG. 2. Referring to FIG. 3A, the first substrate 100 includes a base substrate 110 and a pixel layer 120. The base substrate 110 may include, for example, glass, plastic, silicon, or metal. When the display device is an organic light-emitting display device, a driver for driving a plurality of signal lines and an organic light-emitting diode may be on one surface of the base substrate 110.

The pixel layer 120 is on the base substrate 110 and includes a plurality of pixels PX1, PX2, and PX3 and a pixel peripheral portion NPX. The first to third pixels PX1 to PX3 emit different wavelengths of light, respectively. According to one example implementation, the wavelength of light emitted by the first pixel PX1 may range from about 450 nm to about 495 nm and thus may have a blue color. The wavelength of light emitted by the second pixel PX2 may range from about 495 nm to about 570 nm and thus may have a green color. The wavelength of a light emitted by the third pixel PX3 may range from about 620 nm to about 750 nm and thus may have a red color. By combining light from these pixels PX1 to PX3, a predetermined range of colors of light may be formed for generating images.

When the display device is the organic light-emitting display device, each of the first to third pixels PX1 to PX3 includes an organic light-emitting diode.

The pixel peripheral portion NPX is between the first to third pixels PX1 to PX3. The pixel peripheral portion NPX may secure a separation distance between the first to third pixels PX1 to PX3, in order to prevent color mixing between light emitted by the first to third pixels PX1 to PX3.

When the display device is the organic light-emitting display device, the pixel peripheral portion NPX may be a pixel defining film which functions to define an emission region. The pixel peripheral portion NPX also serves to widen the distance between edges of an anode and a cathode in the organic light-emitting diode. This widening effect may prevent an electric field from being concentrated on the edge of the anode. The pixel defining film may also function to prevent a short circuit of the anode and the cathode.

The first pixel PX1 is on the first emission region EA1. Therefore, light emitted from the first emission region EA1 is the same as light emitted by the first pixel PX1. The second pixel PX2 is on the second emission region EA2. Therefore, light emitted from the second emission region EA2 is the same as light emitted by the second pixel PX2. The third pixel PX3 is on the third emission region EA3. Therefore, light emitted from third emission region EA3 is the same as light emitted by third pixel PX3.

The reflection member 200 may be spaced from or in contact with the first substrate 100.

The opening OP is defined in the reflection member 200 at a position which corresponds to the third emission region EA3. Light from the third emission region EA3 may be emitted externally, without a portion of light reflected by reflection member 200.

The reflection member 200 includes a first reflection member 210 and a second reflection member 220. The first reflection member 210 overlaps the first emission region EA1 and the second emission region EA2. The second reflection member 220 overlaps the non-emission region NEA. Therefore, the first reflection member 210 and the second reflection member 220 are adjacent to each other.

The thickness of the first reflection member 210 and the thickness of the second reflection member 220 may be different from each other. For example, the thickness of the first reflection member 210 may be less than that of second reflection member 220.

The first reflection member 210 may have a thickness ranging, for example, from about 50 Å to about 180 Å. When the thickness of the first reflection member 210 is in the aforementioned thickness range, a portion of light incident on the first reflection member 210 is reflected, and the remaining portion transmits through the first reflection member 210. The reflectivity of the first reflection member 210 may range, for example, from about 5% to about 50%. In another embodiment, the thickness of the first reflection member 210 may be in a different range capable of transmitting a portion of incident light and reflecting the remaining portion. The reflectively range may also be different in another embodiment.

Referring to FIGS. 3A and 3B, light L1 emitted by the first pixel PX1 includes a first reflection light L1-R and a first transmission light L1-T. In the above example, the first light L1 has a wavelength ranging from about 450 nm to about 495 nm. The first reflection light L1-R is generated based on reflection of the first light L1 incident on the first reflection member 210. The first transmission light L1-T is a component of the first light L1 which passes through the first reflection member 210.

A second light L2 emitted by the second pixel PX2 includes a second reflection light L2-R and a second transmission light L2-T. In the above example, the second light L2 has a wavelength ranging from about 495 nm to about 570 nm. The second reflection light L2-R is generated based on reflection of the second light L2 incident on the first reflection member 210. The second transmission light L2-T is a component of the second light L2 which passes through the first reflection member 210.

A third light L3 emitted by the third pixel PX3 passes through the opening OP. In the above example, the third light L3 has a wavelength ranging from about 620 nm to about 750 nm. In this case, the wavelength of the third light L3 is greater than those of the first light L1 and the second light L2.

The second reflection member 220 may have a thickness ranging, for example, from about 250 Å to about 500 Å. When the thickness of the second reflection member 220 is in this thickness range, most of the light incident on the second reflection member 220 is reflected. The reflectivity of the second reflection member 220 may be, for example, about 90% or more. In another embodiment, the thickness of the second reflection member 220 may be in a different range capable of reflecting most of the light incident thereon.

The first reflection member 210 may transmit a portion of the first light L1 and a portion of the second light L2 and may also reflect light incident thereon. In one embodiment, the second reflection member 220 may reflect most of the incident light. Therefore, a display device which provides mirror function may be provided.

When the first reflection member 210 is omitted, the first reflection light L1-R and the second reflection light L2-R are generated so that luminous efficiency is improved, compared to when the first reflection member 210 exists. However, in this case, the area of the portion of the reflection member 210 which is able to provide a mirror function by reflecting exterior light is decreased. As a result, the quality of the mirror function is lowered.

Also, when the reflection member 200 is on an entire surface of the second substrate 300, so that the opening OP is not defined, a portion of the third light L3 may not be emitted externally by the reflection member 200. Therefore, luminous efficiency is lowered. However, in this case, the area of the portion of the reflection member 210, which is able to provide the mirror function by reflecting exterior light, is increased. As a result, the quality of the mirror function is improved.

In the above cases, mirror function quality and luminous efficiency are trade-offs, e.g., increasing one will produce a reduction in the other.

In order to provide an improved display device with a mirror function, as illustrated in FIGS. 1 to 3B, opening OP is defined in a portion of the reflection 200 corresponding to the third emission region EA3. An example of the effects of these embodiments are described with reference to Table 1.

TABLE 1

| Reflection member | Polarization member | Luminous efficiency ratio | | | |
|---|---|---|---|---|---|
| | | MQF | Red color | Green color | Blue color |
| Non-Disposition | Non-disposition | 0.566 | 1.309 | 1.36 | 1.910 |
| Disposition | Non disposition | 0.113 | 0.596 | 0.735 | 1.165 |

In Table 1, luminous efficiency ratio is shown, by color, based on light energy for the case where a reflection member is included and a polarization member is not included and the case where a reflection member and a polarization member are not included. As shown, the lower the luminous efficiency ratio, the lower the luminous efficiency. In order to calculate data of Table 1, ITO, Ag, and ITO films were sequentially stacked, and reflection members respectively having thicknesses of about 70 Å, about 155 Å, and about 100 Å were used.

Table 1 also includes mirror quality function (MQF). MQF is a value obtained by irradiating a laser on the reflection member and measuring diffraction and scattering degrees of the laser. The lower the MQF, the lower the amount of diffraction and scattering that occurs. Therefore, the mirror effect perceived by a user increases with lower values of MQF.

Referring to Table 1, when the reflection member is not disposed, the MQF value is about 0.566. On the contrary, when the reflection member is disposed, the MQF value is about 0.113. Thus, it may be seen that when the reflection member is disposed, the MOF value is decreased and performance of the mirror is improved.

The cases where the reflection member is disposed and not disposed may be compared as follows. The ratio of luminous efficiency of the color red is about 0.596/1.309=0.455. The ratio of luminous efficiency for the color green is about 0.735/1.36=0.540. The ratio of luminous efficiency for the color blue is about 1.165/1.910=0.610. Thus, when the values are compared, it may be seen that the red color changes greatly in terms of luminous efficiency based on whether or not the reflection member is present.

Therefore, as illustrated in FIGS. 3A and 3B, when the opening OP is defined in the region of the reflection member 200 corresponding to the third emission region EA3, the luminous efficiency of the red color may be improved. That is, the reason why the opening OP is defined in the reflection member 200 to correspond to the third emission region EA3 is because the red color changes greatly in terms of luminous efficiency based on whether or not the opening OP is present. In another embodiment, the opening OP may be defined in a region corresponding to the first emission region EA1 or the second emission region EA2.

TABLE 2

| | Luminous efficiency ratio with respect to polarization film | | | | | | | |
|---|---|---|---|---|---|---|---|---|
| Opening (OP) | First region | Second region | Third region | Fourth region | Fifth region | Sixth region | Seventh region | Average |
| Definition | 2.28 | 1.98 | 1.96 | 1.65 | 1.62 | 1.34 | 1.30 | 1.73 |
| Non-definition | 0.91 | 0.81 | 0.80 | 0.70 | 0.70 | 0.59 | 0.59 | 0.73 |
| Ratio (%) | 250.55 | 244.44 | 245.00 | 235.71 | 231.43 | 227.12 | 220.34 | 236.37 |

Table 2 shows luminous efficiency ratios obtained by dividing the display region of the display device into a plurality of regions (e.g., first to seventh regions). In Table 2, the luminous efficiency ratios with respect to a polarization film correspond to those in Table 1. However, unlike the luminous efficiency ratios of Table 1 measured by distinguishing colors, the luminous efficiency ratios of Table 2 are measured by dividing the display region into seven regions.

Referring to Table 2, when the opening OP is defined in a region of the reflection member corresponding to the third emission region EA3 in accordance with one embodiment, an average of the luminous efficiency is about 1.73 times higher than that when the polarization film is present instead of the reflection member. Unlike this embodiment, when the reflection member is on the entire surfaces of emission regions EA1, EA2, and EA3, the average of the luminous efficiency is lowered to about 0.73 times, compared to that when the polarization film is present instead of the reflection member. Thus, in accordance with the present embodiment, the average of the luminous efficiency averagely increases by about 1.73/0.73×100=236.37% compared to when the reflection member is present on all surfaces of the emission regions EA1, EA2, and EA3.

Thus, according to one embodiment, the display device is able to provide a mirror function having excellent quality and high luminous efficiency.

The reflection member 200 may include at least one selected from aluminum (Al), chromium (Cr), silver (Ag), iron (Fe), platinum (Pt), mercury (Hg), nickel (Ni), tungsten (W), vanadium (V), and molybdenum (Mo). These materials have a property of reflecting light. In another embodiment, the reflection member 200 may include any other material having light reflecting property.

In the present embodiment, the second substrate 300 is spaced apart from the first substrate 100. The second substrate 300 includes a first surface 301 and a second surface 302. The first surface 301 is a surface facing the first substrate 100. The second surface 302 is on an opposite side of the first surface 301 in the second substrate 300.

The reflection member 200 is on the first surface 301. However, the position of the reflection member 200 may be on the second surface 302.

When the display device is an organic light-emitting display device, the second substrate 300 may be an encapsulating layer. In this case, the second substrate 300 may use a glass substrate or various plastic substrates such as an acryl substrate.

When the display device is a top-emission type organic light-emitting display device, the second substrate 300 may include electric insulation material having high transmittance with respect to light emitted from the first to third pixels PX1 to PX3, which include organic light-emitting diodes. The electric insulation material may include, for example, transparent glass such as alkali glass or alkali-free glass, polyethylene terephthalate, polycarbonate, polyether sulfone, polyvinyl fluoride (PVF), polyacrylate, transparent ceramics such as zirconia, or quartz.

When the display device is an organic light-emitting display device, a bonding member may be provided between the first substrate 100 and the second substrate 300. The bonding member functions to bond the first substrate 100 and the second substrate 300. The bonding member may be on an edge of the first substrate 100, and the first to third pixels PX1 to PX3 including organic light-emitting diodes may be surrounded by the bonding member.

The bonding member may include, for example, a sealant and a spacer. The sealant may seal the first substrate 100 and the second substrate 300. The sealant may include, for example, a UV hardener such as epoxy or a thermal hardener.

The spacer may be in the sealant and operates to maintain a predetermined distance between the first substrate 100 and the second substrate 300. A mura (e.g., such as Newton's ring generated between the first substrate 100 and the second substrate 300) may be prevented by adjusting the length of the spacer. Newton's ring may include an interference fringe having an irregular ring shape, which is generated when an air layer between the first substrate 100 and the second substrate 300 functions as a thin film.

Figure 3C:
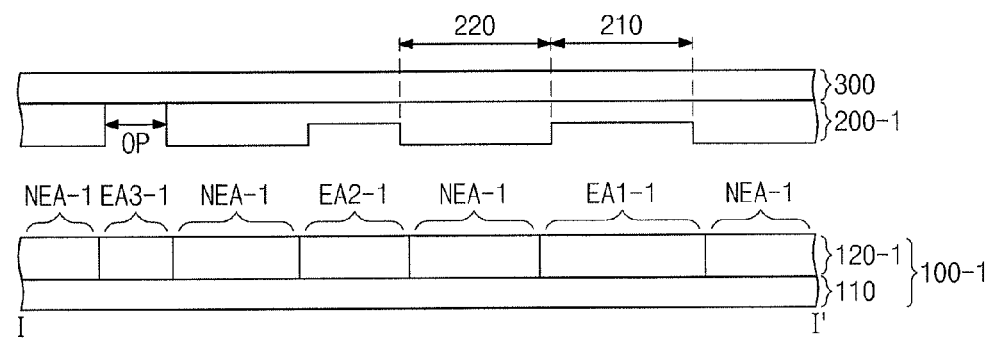

FIG. 3C is a cross-sectional view taken along line I-I' in FIG. 2. Referring to FIG. 3C, a first substrate 100-1 includes a base substrate 110-1 and a pixel layer 120-1. The pixel layer 120-1 includes a first emission region EA1-1, a second emission region EA2-1, a third emission region EA3-1, and a non-emission region NEA-1. The first emission region EA1-1, the second emission region EA2-1, and the third emission region EA3-1 may have different areas. This is because the efficiency of light emitted from the first emission region EA1-1, the second emission region EA2-1, and the third emission region EA3-1 may be different from each other.

Generally, the efficiency of light having a wavelength ranging from about 450 nm to about 495 nm and emitted from the first emission region EA1-1 is lower than efficiencies of light emitted from the second emission region EA2-1 and the third emission region EA3-1. Also, the efficiency of light having a wavelength ranging from about 620 nm to about 750 nm and emitted from the third emission region EA3-1 is higher than efficiencies of light emitted from the first emission region EA1-1 and the second emission region EA2-1. Therefore, a consumer may feel that the intensities of light emitted from the first emission region EA1-1, the second emission region EA2-1, and the third emission region EA3-1 are similar when the area of the first emission region EA1-1 having low efficiency is increased and the area of the third emission region EA3-1 having high efficiency is decreased.

A variation in the areas of the emission regions EA1-1, EA2-1, and EA3-1 may produce a variation in the areas of a first reflection member 210-1 and a second reflection member 22-1 in a reflection member 200-1.

The area of the opening OP may be smaller than that of the third emission region EA3-1. When the area of the opening OP is the same as that of the third emission region EA3-1 in the organic light-emitting display device, scattered reflection may be generated due to a pixel defining film on the non-emission region NEA. When the area of the opening OP is smaller than that of the third emission region EA3-1, the scattered reflection generated due to the pixel defining film may be reduced to improve the quality of the display device. The second substrate 300 is on the reflection member 200-1.

Figure 4:
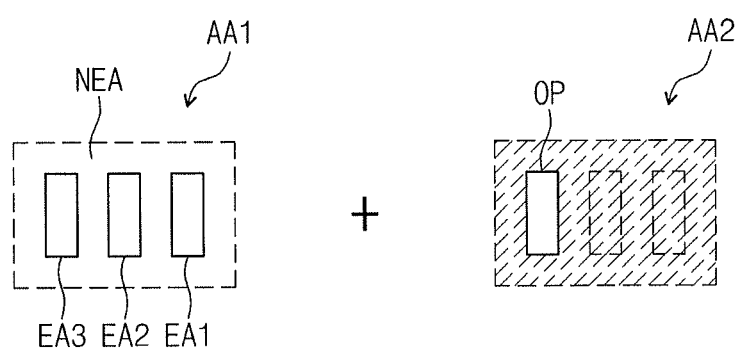
FIG. 4 illustrates examples of portions AA1 and AA2 in FIG. 1.

FIG. 4 is a plan view illustrating an embodiment of portions AA1 and AA2 in FIG. 1. Referring to FIG. 4, the portion AA1 includes a first emission region EA1, a second emission region EA2, a third emission region EA3, and a non-emission region NEA. The portion AA2 includes a region of the reflection member 200 which overlaps the first emission region EA1, the second emission region EA2, and a non-emission region NEA. The portion AA2 overlaps the portion AA1.

In the reflection member 200, an opening OP is defined in a region corresponding to the third emission region EA3. The light emitted from the third emission region EA3 may be emitted externally by the opening OP without hindrance of the reflection member 200.

Figure 5:
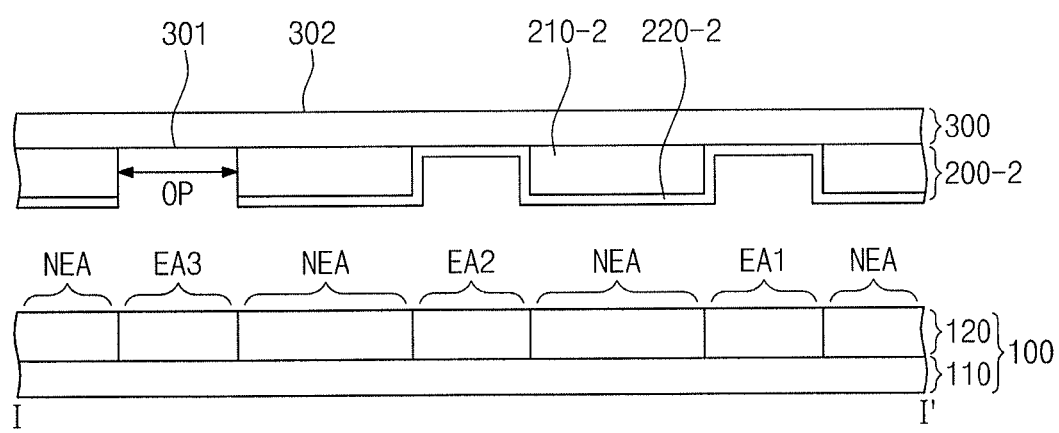
FIGS. 5 and 6 illustrate examples of sectional views of the embodiment in FIG. 2.
Figure 6:
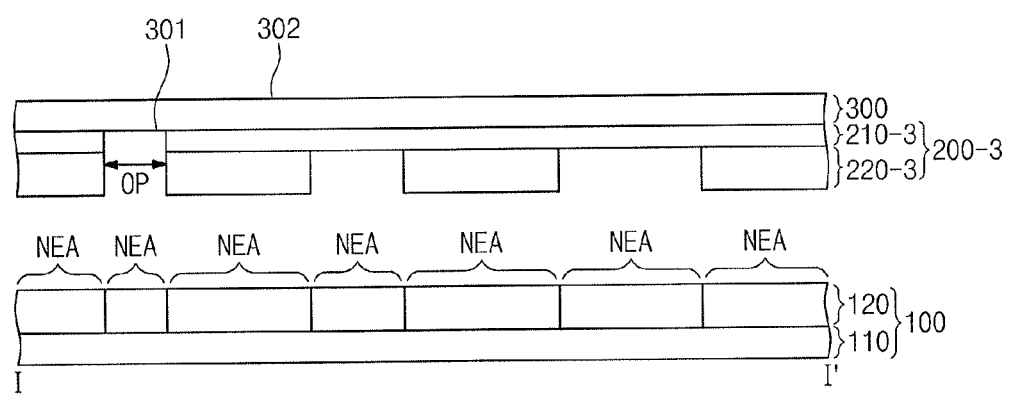

FIGS. 5 and 6 are examples of cross-sectional views taken along line I-I' of FIG. 2. The first substrate 100 and the second substrate 300 may be substantially the same as those in FIGS. 3A and 3B.

Referring to FIG. 5, a reflection member 200-2 includes a main reflection member 210-2 and a sub reflection member 220-2. The main reflection member 210-2 overlaps the non-emission region NEA. The sub reflection member 220-2 covers the main reflection member 210-2 and is on the first surface 301. For example, the sub reflection member 220-2 may be disposed on an entire surface of the first surface 301, except for a region corresponding to the opening OP.

The main reflection member 210-2 is thicker than the sub reflection member 220-2. The main reflection member 210-2 may have a thickness ranging, for example, from about 200 Å to about 320 Å. The sub reflection member 220-2 may have a thickness ranging, for example, from about 50 Å to about 180 Å. When the thicknesses of the main reflection member 201-2 and the sub reflection member 220-2 are in the aforementioned thickness ranges, the reflectivity of a region of the reflection member 200-2 corresponding to the non-emission region NEA may be about 90% or more. When the reflectivity of the region of the reflection member 200-2 corresponding to the non-emission region NEA is about 90% or more, the quality of the mirror function provided by the display device is improved.

When the thickness of the sub reflection member 220-2 is in the aforementioned thickness range, reflectivity of a region of the reflection member 220-2 corresponding to emission regions EA1, EA2, and EA3 may range from about 5% to about 50%. When the reflectivity of the region of the reflection member 220-2 corresponding to emission regions EA1, EA2, and EA3 ranges from about 5% to about 50%, a portion of incident light may be transmitted and the remaining portion may be reflected. As a result, a display device providing a mirror function may be provided.

Referring to FIG. 6. the first substrate 100 and the second substrate 200 may be substantially the same as those in FIGS. 3A and 3B. A reflection member 200-3 includes a first reflection layer 210-3 and a second reflection layer 220-3.

The first reflection layer 210-3 contacts an entire surface of the first surface 301, except for a region in which the opening OP is defined. The second reflection layer 220-3 is on one surface of the first reflection layer 210-3 to overlap the non-emission region NEA. The second reflection layer 220-3 is thicker than the first reflection layer 210-3. The first reflection member 210-3 may have a thickness ranging, for example, from about 50 Å to about 180 Å. The second reflection layer 220-3 may have a thickness ranging, for example, from about 250 Å to about 320 Å.

When the thicknesses of the first reflection layer 210-3 and the second reflection layer 220-3 are in the aforementioned thickness ranges, the reflectivity of a region of the reflection member 200-3 corresponding to the non-emission region NEA may be about 90% or more. When the reflectivity of the region of the reflection member 200-2 corresponding to the non-emission region NEA is about 90% or more, the quality of the mirror function provided by the display device is improved.

When the thickness of the second reflection layer 220-3 is in the aforementioned thickness range, reflectivity of a region of the reflection member 200-3 corresponding to emission regions EA1, EA2, and EA3 may range, for example, from about 5% to about 50%. When the reflectivity of the region of the reflection member 200-3 corresponding to emission regions EA1, EA2, and EA3 ranges from about 5% to about 50%, a portion of incident light may be transmitted and the remaining portion may be reflected. As a result, a display device having an mirror function may be provided.

Figure 7:
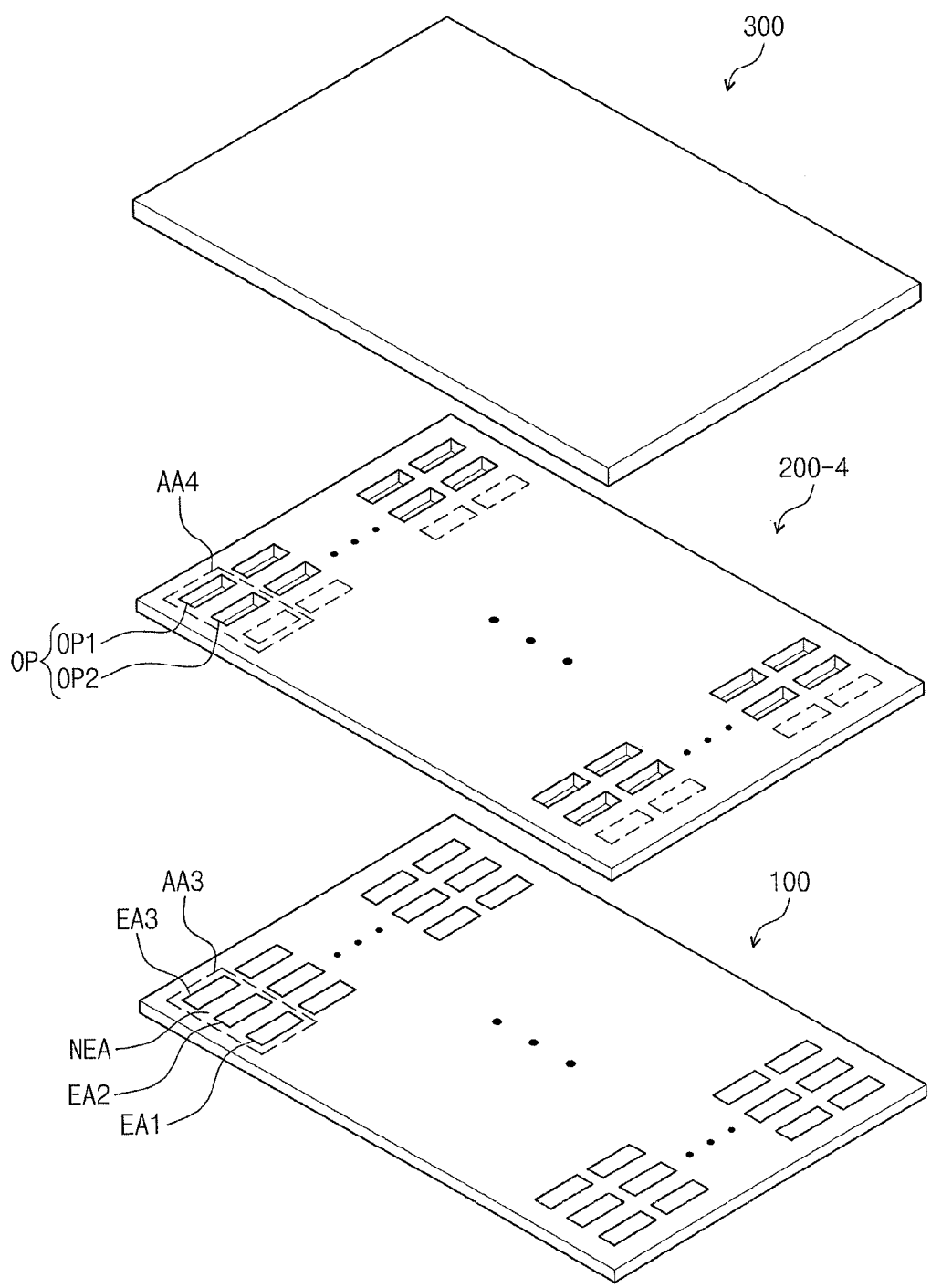
FIG. 7 illustrates another embodiment of a display device.
Figure 8:
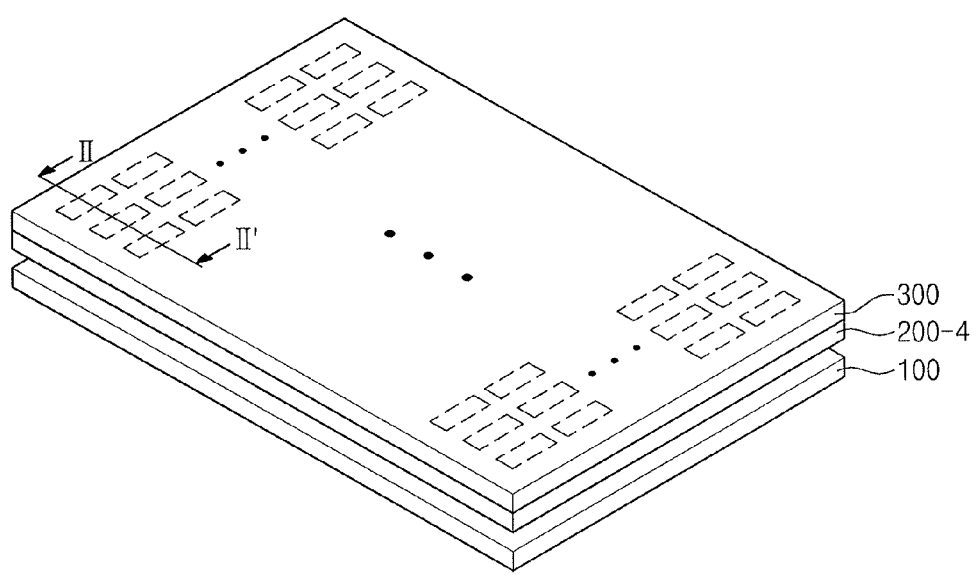
FIG. 8 illustrates an example of an assembled view of the embodiment in FIG. 7.
Figure 9:
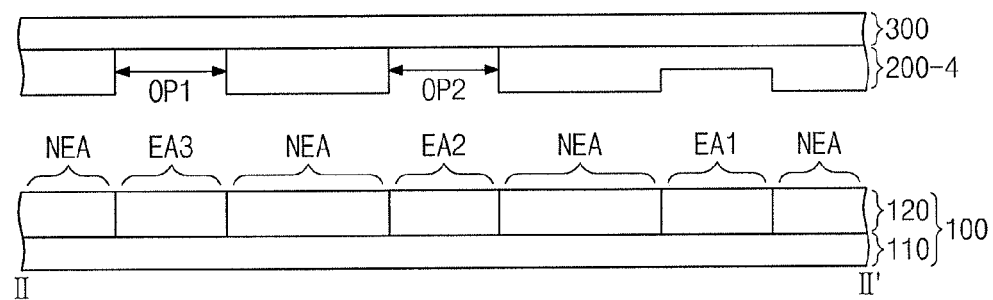
FIG. 9 illustrates a sectional view of the embodiment of FIG. 8.
Figure 10:
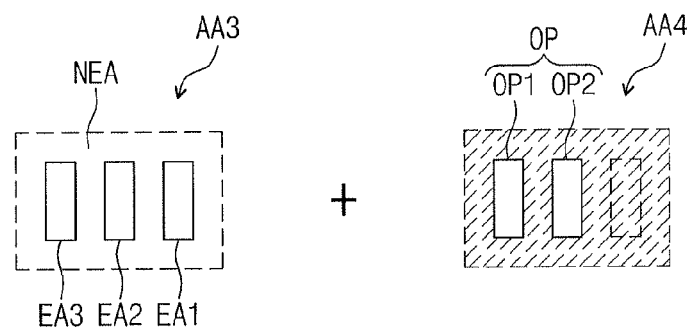
FIG. 10 illustrates an example of portions AA3 and AA4 in FIG. 7.

FIG. 7 is an exploded perspective view illustrating another embodiment of a display device including a first substrate, a reflection member, and a second substrate. FIG. 8 is a perspective view illustrating a state in which a first substrate, a reflection member, and a second substrate in FIG. 7 are assembled. FIG. 9 is a cross-sectional view taken along line II-II' of FIG. 8. FIG. 10 is a plan view illustrating embodiments of portions AA3 and AA4 of FIG. 7. The first substrate 100 and the second substrate 200 may be substantially the same as those in FIGS. 1 to 6.

Referring to FIGS. 7 and 8, openings OP are defined in regions of the reflection member 200-4 corresponding to the second emission region EA2 and the third emission region EA3. The openings OP include a first opening OP1 and a second opening OP2. The thickness and material of the reflection member 200-4 may be substantially the same as those in FIGS. 3A and 3B.

Referring to FIGS. 9 and 10, the first opening OP1 is defined in a portion corresponding to the third emission region EA3. The second opening OP2 is defined in a portion corresponding to the second emission region EA2. Based on the first opening OP and the second opening OP2, light emitted from the second emission region EA2 and the third emission region EA3 may be emitted externally without interruption of the reflection member 200-4.

The wavelength of light emitted by the first emission region EA1 may range, for example, from about 450 nm to about 495 nm and thus may correspond to the color blue. The wavelength of light emitted from the second emission region EA2 may range, for example, from about 495 nm to about 570 nm and thus may correspond to the color green. The wavelength of light emitted by the third emission region EA3 may range, for example, from about 620 nm to about 750 nm and thus may correspond to the color red.

Referring to Table 1 described above, when light passes through the reflection member, the reduction in luminous efficiencies of the red and green color light is greater than the reduction in luminous efficiency of the blue color light. Therefore, when the first opening OP1 and the second opening OP2 are defined in regions corresponding to the third emission region EA3 and the second emission region EA2 in which a variation range of luminous efficiency is high, a display device having a mirror function may be provided with excellent quality and high luminous efficiency.

In accordance with one or more of the aforementioned embodiments, a display device including a mirror function having excellent quality and high luminous efficiency may be provided.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A display device, comprising:
   a first substrate including a first emission region, a second emission region, a third emission region, and a non-emission region; and
   a reflection layer overlapping the first emission region, the second emission region, and the non-emission region, the reflection layer having an opening corresponding to the third emission region, wherein the first emission region, the second emission region, and the third emission region are to emit different color light.

2. The display device as claimed in claim 1, wherein the reflection layer overlaps substantially an entirety of the first emission region and the second emission region.

3. The display device as claimed in claim 2, wherein the third emission region is to emit light having a wavelength longer than light to be emitted from the first emission region and the second emission region.

4. The display device as claimed in claim 3, wherein the light to be emitted from the third emission region has a wavelength ranging from about 610 nm to about 750 nm.

5. The display device as claimed in claim 4, wherein organic light-emitting diodes are on respective ones of the first emission region, the second emission region, and the third emission region.

6. The display device as claimed in claim 5, further comprising:
   a second substrate spaced from the first substrate,
   wherein the reflection layer is on the second substrate.

7. The display device as claimed in claim 6, wherein the second substrate includes:
   a first surface facing the first substrate; and
   a second surface that is an opposite surface of the first surface,
   wherein the reflection layer is on the first surface.

8. The display device as claimed in claim 1, wherein the third emission region has an area smaller than an area of each of the first emission region and the second emission region.

9. The display device as claimed in claim 1, wherein the reflection layer includes at least one of aluminum, chromium, silver, iron, platinum, mercury, nickel, tungsten, vanadium, or molybdenum.

10. The display device as claimed in claim 1, wherein the opening has an area smaller than an area of the third emission region.

11. The display device as claimed in claim 7, wherein the reflection layer includes:
    a first reflection layer overlapping the first emission region and the second emission region; and
    a second reflection layer overlapping the non-emission region, wherein the first reflection layer is thicker than the second reflection layer.

12. The display device as claimed in claim 11, wherein:
    the first reflection layer has a thickness ranging from about 50 Å to about 180 Å, and
    the second reflection layer has a thickness ranging from about 250 Å to about 500 Å.

13. The display device as claimed in claim 11, wherein the first reflection layer includes:
    a main reflection layer overlapping the non-emission region: and
    a sub reflection layer covering the main reflection layer and disposed on the first surface.

14. The display device as claimed in claim 13, wherein:
    the main reflection layer has a thickness ranging from about 200 Å to about 320 Å, and
    the sub reflection layer has a thickness ranging from about 50 Å to about 180 Å.

15. The display device as claimed in claim 7, wherein the reflection layer includes:
    a first reflection layer contacting the first surface; and
    a second reflection layer on one surface of the first reflection layer and overlapping the non-emission region.

16. The display device as claimed in claim 15, wherein:
    the first reflection layer has a thickness ranging from about 50 Å to about 180 Å, and
    the second reflection layer has a thickness ranging from about 250 Å to about 320 Å.

17. The display device as claimed in claim 1, wherein the reflection layer includes:
    a first reflection layer overlapping the first emission region and the second emission region; and
    a second reflection layer overlapping the non-emission region, wherein a reflectivity of the first reflection layer is less than a reflectivity of the second reflection layer.

18. The display device as claimed in claim 17, wherein:
    the reflectivity of the first reflection layer ranges from about 5% to about 50%, and
    the reflectivity of the second reflection layer ranges from about 90% to about 100%.

19. A display device, comprising:
    a first substrate including a first emission region, a second emission region, a third emission region, and a non-emission region; and
    a reflection layer overlapping the first emission region and the non-emission region and having an opening corresponding to the second emission region and the third emission region, wherein the first emission region, the second emission region, and the third emission region are to emit different color light.

20. The display device as claimed in claim 19, wherein each of the second emission region and the third emission region is to emit light having a wavelength longer than a wavelength of light to be emitted from the first emission region.

* * * * *